United States Patent
Feng et al.

(10) Patent No.: US 12,033,576 B2
(45) Date of Patent: Jul. 9, 2024

(54) DISPLAY PANEL AND DRIVE METHOD THEREFOR

(71) Applicants: Chengdu BOE Optoelectronics Technology Co., Ltd., Sichuan (CN); BOE Technology Group Co., Ltd., Beijing (CN)

(72) Inventors: Lei Feng, Beijing (CN); Shuiming Lv, Beijing (CN); Weibo Hu, Beijing (CN); Guoqiang Wu, Beijing (CN); Chungkee Cheng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/921,320

(22) PCT Filed: Jun. 8, 2021

(86) PCT No.: PCT/CN2021/098854
§ 371 (c)(1),
(2) Date: Oct. 25, 2022

(87) PCT Pub. No.: WO2022/017024
PCT Pub. Date: Jan. 27, 2022

(65) Prior Publication Data
US 2023/0267881 A1    Aug. 24, 2023

(30) Foreign Application Priority Data
Jul. 23, 2020   (CN) .......................... 202010716277.X

(51) Int. Cl.
*G09G 3/20*     (2006.01)
*G09G 3/3233*   (2016.01)

(52) U.S. Cl.
CPC ......... *G09G 3/3233* (2013.01); *G09G 3/2096* (2013.01); *G09G 2300/0819* (2013.01);
(Continued)

(58) Field of Classification Search
CPC ............... G09G 3/3233; G09G 3/2096; G09G 2300/0819; G09G 2300/0852;
(Continued)

(56) References Cited

U.S. PATENT DOCUMENTS

2006/0271757 A1\* 11/2006 Kim ..................... G09G 3/3266
711/167
2010/0091046 A1\*  4/2010 Matsuura ............. G09G 3/3677
345/87
(Continued)

FOREIGN PATENT DOCUMENTS

| CN | 102034426 A | 4/2011 |
| CN | 102103847 A | 6/2011 |

(Continued)

OTHER PUBLICATIONS

CN202010716277.X first office action.
CN202010716277.X second office action.
PCT/CN2021/098854 international search report.

*Primary Examiner* — Towfiq Elahi
(74) *Attorney, Agent, or Firm* — IPro, PLLC

(57) ABSTRACT

A display panel and a drive method therefor, where when a gate electrode drive circuit (100) scans pixels line-by-line, a drive chip (300) controls a clock signal end to input a clock control signal (CK) into the gate electrode drive circuit (100), which causes a gate electrode scan signal (G(n)) to be output by the gate electrode drive circuit (100), and a data signal (Vd) output by a data signal end is controlled to be written to a corresponding row of pixel circuits (200). Where an active level period of the clock control signal (CK) falls within an active level period of the data signal (Vd), and a
(Continued)

start time for the active level period of the data signal (Vd) is at least 1-2 μs earlier than a start time for the active level period of the clock control signal (CK).

19 Claims, 6 Drawing Sheets

(52) U.S. Cl.
CPC .............. *G09G 2300/0852* (2013.01); *G09G 2310/0205* (2013.01); *G09G 2310/0286* (2013.01); *G09G 2310/08* (2013.01); *G09G 2320/0209* (2013.01)

(58) Field of Classification Search
CPC ... G09G 2310/0205; G09G 2310/0286; G09G 2310/08; G09G 2320/0209
See application file for complete search history.

(56) References Cited

U.S. PATENT DOCUMENTS

| | | |
|---|---|---|
| 2011/0148851 A1 | 6/2011 | Sugiyama et al. |
| 2017/0061865 A1* | 3/2017 | Park ................... G09G 3/325 |
| 2018/0175854 A1 | 6/2018 | Yang et al. |
| 2018/0286313 A1 | 10/2018 | Zheng |
| 2019/0019452 A1 | 1/2019 | Zhu et al. |
| 2020/0005697 A1* | 1/2020 | Yu ..................... G09G 5/006 |
| 2020/0111399 A1 | 4/2020 | Wang et al. |
| 2020/0342808 A1 | 10/2020 | Han et al. |
| 2021/0005152 A1 | 1/2021 | Shan |
| 2021/0012730 A1 | 1/2021 | Kang |
| 2021/0210034 A1 | 7/2021 | Yang |

FOREIGN PATENT DOCUMENTS

| | | |
|---|---|---|
| CN | 105825814 A | 8/2016 |
| CN | 105976747 A | 9/2016 |
| CN | 106297667 A | 1/2017 |
| CN | 107180619 A | 9/2017 |
| CN | 109360536 A | 2/2019 |
| CN | 109584799 A | 4/2019 |
| CN | 109658893 A | 4/2019 |
| CN | 109671410 A | 4/2019 |
| CN | 110164361 A | 8/2019 |
| CN | 110660367 A | 1/2020 |
| CN | 111210776 A | 5/2020 |
| CN | 111696483 A | 9/2020 |
| JP | 2009168897 A | 7/2009 |
| TW | 637369 B | 10/2018 |

\* cited by examiner

DISPLAY PANEL AND DRIVE METHOD THEREFOR

CROSS REFERENCE TO RELATED APPLICATIONS

The present disclosure is a US National Stage of International Application No. PCT/CN2021/098854, filed on Jun. 8, 2021, which claims the benefit of priority to Chinese Patent Application No. 202010716277.X, filed to the Chinese Patent Office on Jul. 23, 2020 and entitled "DISPLAY PANEL AND DRIVE METHOD THEREFOR", which is incorporated in its entirety herein by reference.

FIELD

The present disclosure relates to the technical field of display, in particular to a display panel and a drive method therefor.

BACKGROUND

With the advantages of low energy consumption, fast response speed, wide viewing angle, light weight, thinness and high flexibility, an organic light emitting diode (OLED) display technology has huge potential.

Since an OLED display screen is controlled to be turned on by writing data signals in a line-by-line scanning manner, there are a large number of signal lines in the display screen, causing an inevitable crosstalk problem. If a difference between two adjacent rows of data signals stored in the display screen is great, a potential of a power signal will change. Thus, the data signals will change under the influence of the power signal when written, thereby generating a difference in brightness, and further affecting a display effect.

SUMMARY

An embodiment of the present disclosure provides a drive method for a display panel. The display panel includes: a plurality of pixels, configured to display a picture; a plurality of pixel circuits, configured to control the plurality of pixels to emit light for display; and a gate drive circuit arranged on a side of the plurality of pixel circuits and configured to output a gate scanning signal to the plurality of pixel circuits;

where the drive method includes: controlling, when the gate drive circuit scans the plurality of pixels line by line, a clock signal end to input a clock control signal to the gate drive circuit, to make the gate drive circuit to output the gate scanning signal, and controlling a data signal output by a data signal end to be written into a row of pixel circuits;

where an active level period of the clock control signal falls within an active level period of the data signal, and a start time of the active level period of the data signal is at least 1 μs-2 μs earlier than that of the active level period of the clock control signal.

In some embodiments of the present disclosure, a duty ratio of the active level period of the data signal in a scanning period of a row of pixels is greater than 50%.

In some embodiments of the present disclosure, a duty ratio of the active level period of the clock control signal in the scanning period of the row of pixels is less than 50%.

In some embodiments of the present disclosure, the active level period of the clock control signal is less than or equal to half of that of the data signal.

In some embodiments of the present disclosure, an end time of the active level period of the clock control signal is earlier than that of the active level period of the data signal.

In some embodiments of the present disclosure, the end time of the active level period of the clock control signal is at least 1 μs-2 μs earlier than that of the active level period of the data signal.

In some embodiments of the present disclosure, the active level period of the data signal is 4 μs-6 μs.

In some embodiments of the present disclosure, the active level period of the clock control signal is 2 μs-3 μs.

In some embodiments of the present disclosure, the start time of the active level period of the data signal is at least 1 μs later than start time of the scanning period of the row of pixels.

In some embodiments of the present disclosure, the end time of the active level period of the data signal is at least 1 μs earlier than the end time of the scanning period of the row of pixels.

An embodiment of the present disclosure provides a display panel. The display panel includes: a plurality of pixels, configured to display a picture; a plurality of pixel circuits, configured to control the plurality of pixels to emit light for display; a gate drive circuit arranged on a side of the plurality of pixel circuits and configured to output a gate scanning signal to the plurality of pixel circuits; and a drive chip connected to the gate drive circuit and the plurality of pixel circuits, where the drive chip is configured to output a control signal to the gate drive circuit and the plurality of pixel circuits;

where when the gate drive circuit scans the pixels line by line, the drive chip controls a clock signal end to input a clock control signal to the gate drive circuit, to make the gate drive circuit to output the gate scanning signals, and controls a data signal output by a data signal end to be written into a row of pixel circuits; and an active level period of the clock control signal falls within an active level period of the data signal, and a start time of the active level period of the data signal is at least 1 μs-2 μs earlier than that of the active level period of the clock control signal.

BRIEF DESCRIPTION OF THE DRAWINGS

In order to describe the technical solutions of the embodiments of the present disclosure more clearly, the accompanying drawings required to be used in the embodiments of the present disclosure will be briefly introduced below. Obviously, the accompanying drawings introduced below show merely some embodiments of the present disclosure, and those of ordinary skill in the art would be able to derive other accompanying drawings from these accompanying drawings without creative efforts.

DETAILED DESCRIPTION OF THE EMBODIMENTS

Figure 1:
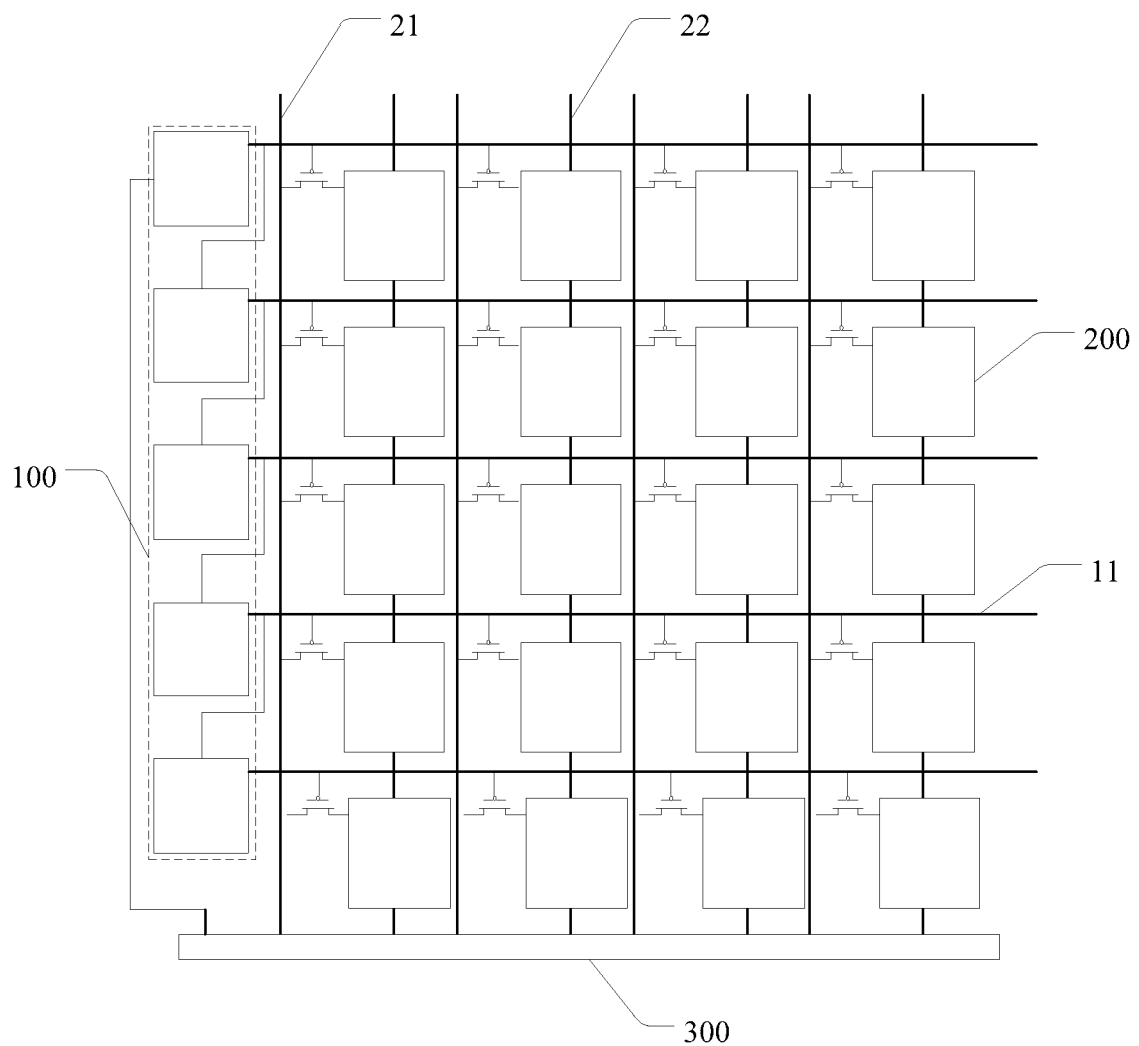
FIG. 1 is a schematic structural diagram of a display panel according to an embodiment of the present disclosure.

In order to make the above objectives, features and advantages of the present disclosure clearer and more comprehensible, the present disclosure will be further described below in conjunction with the accompanying drawings and the embodiments. The illustrative implementations can be embodied in many forms, and should not be construed as limited to the implementations stated herein; rather, these implementations are provided to make the present disclosure more thorough and complete, and the concept of the illustrative implementations will be fully conveyed to those skilled in the art. The same reference numerals in the accompanying drawings denote the same or similar structures, and thus repeated descriptions thereof will be omitted. The words expressing positions and directions described in the present disclosure are all illustrated with the accompanying drawings as examples, and can be changed according to requirements, and all the changes fall within the scope of protection of the present disclosure. The accompanying drawings of the present disclosure are merely used for illustrating relative position relations and are not intended to represent true proportions.

An OLED display panel is a display panel with an organic light emitting diode as a light emitting device. As a new generation of display technology, compared with a liquid crystal display (LCD) panel, the OLED panel has a thickness controlled within 1 mm, and the entirety is thinner and lighter. An OLED screen has a wide viewing angle which an LCD screen does not have, allowing for an ultra large viewing range without distortion. The OLED screen has a response speed which is one thousandth of that of the LCD screen. The OLED screen is resistant to low temperature and may normally display contents at −40° C. With the advantages of lightness, thinness, high brightness, low power consumption, fast response, high definition, desirable flexibility and high luminous efficiency, the OLED screen occupies an increasingly significant position in the display field.

An OLED device includes an anode, a light emitting layer and a cathode. The anode, the light emitting layer and the cathode form a sandwich structure. After an electric field is generated between the anode and the anode, electrons and holes move to the light emitting layer and are combined into excitons in the light emitting layer, and the excitons excite light emitting molecules to finally generate visible light.

Embodiments of the present disclosure provide a display panel. The display panel is an OLED display panel, and may be specifically any product or component having a display function, such as a mobile phone, a tablet computer, a television, a display, a notebook computer, a digital photo frame and a navigator.

FIG. 1 is a schematic structural diagram of a display panel according to an embodiment of the present disclosure.

With reference to FIG. 1, a display panel provided in embodiments of the present disclosure includes: a plurality of pixels (not shown in the figure), a gate drive circuit 100, pixel circuits 200 and a drive chip 300.

Each pixel is connected to one pixel circuit, and the pixels are driven to emit light by the pixel circuits 200. The pixels of the OLED display panel are organic light emitting diode devices. During specific implementation, the OLED devices may include red OLED devices, green OLED devices and blue OLED devices, and the corresponding pixels may be driven for full-color display by controlling signals of the gate drive circuit 100 and the pixel circuits 200. In addition, white OLED devices may be used in combination with a color film to implement full-color display, which is not limited herein.

The pixels of the OLED display panel are distributed in a display area, each pixel is correspondingly connected to one pixel circuit 200, and the gate drive circuit 100 is arranged in a non-display area on one side of the display area. The gate drive circuit 100 is configured to output gate scanning signals to the pixel circuits 200, and data signals are written into the pixel circuits 200 under the control of the gate scanning signals. The data signals are signals for controlling gray scales of light emitting brightness of the pixels, and the gray scales of the pixels may be controlled by writing different data signals into the pixel circuits 200 corresponding to the pixels.

In the above display panel provided in embodiments of the present disclosure, the gate drive circuit includes shift registers cascaded to each other, an input signal of a first stage of shift register is provided by the drive chip, and in addition, an output signal of each stage of shift register serves as an input signal of a next stage of shift register. An output end of each stage of shift register is connected to one gate signal line 11, and the gate signal line 11 is configured to transmit the gate scanning signal for controlling the row of pixels.

Figure 2:
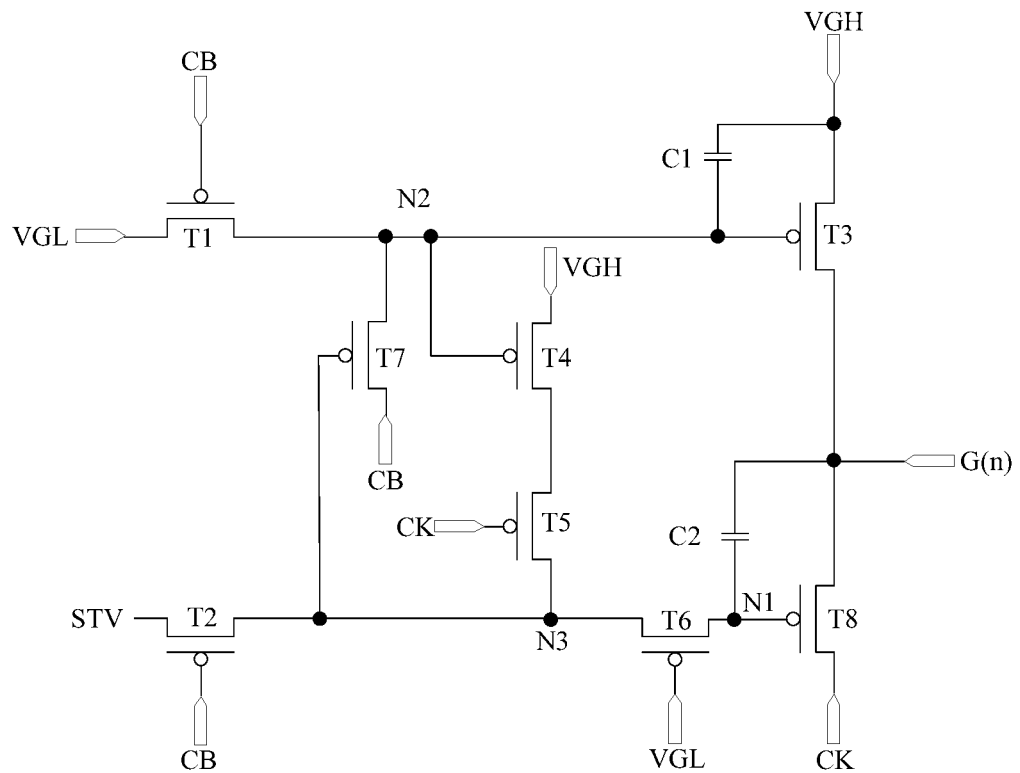
FIG. 2 is an equivalent circuit diagram of a shift register according to an embodiment of the present disclosure.
Figure 3:
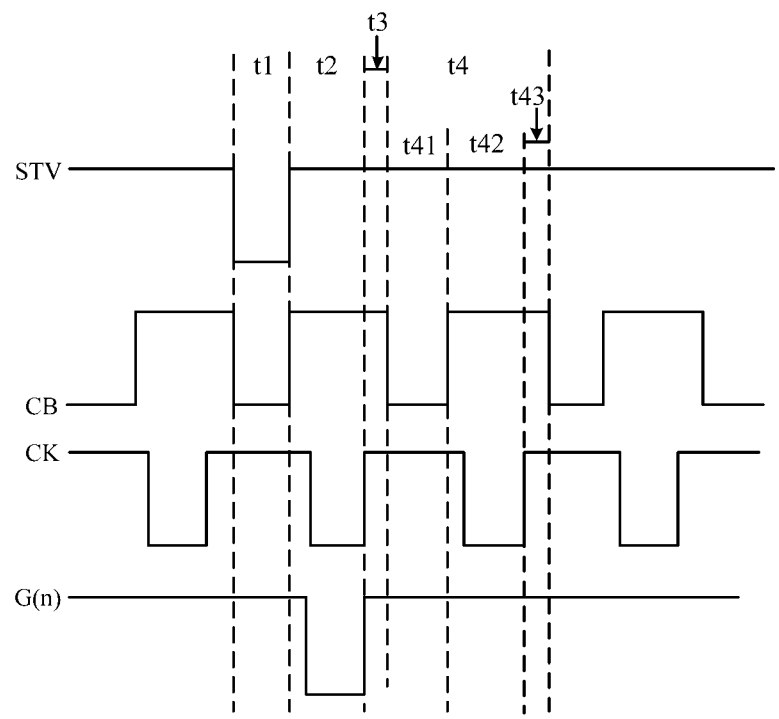
FIG. 3 is a time sequence diagram of the shift register shown in FIG. 2.

FIG. 2 is an equivalent circuit diagram of a shift register according to an embodiment of the present disclosure, and FIG. 3 is a time sequence diagram of the shift register shown in FIG. 2.

With reference to FIGS. 2 and 3, the shift register provided in embodiments of the present disclosure includes eight transistors and two capacitors. The eight transistors are p-type transistors, and a low level signal is an active level. A specific working principle is as follows.

In an input stage t1, a first clock control signal provided by a first clock signal end CB is a low level signal, a second clock control signal provided by a second clock signal end CK is a high level signal, and an input signal Vin provided by an input voltage signal end STV is a low level signal, for example, the input signal Vin is equal to a first power signal VL.

Since the first clock control signal is a low level signal, the second transistor T2 is conducted, and the input signal is transmitted to a third node N3 by the second transistor T2. Since the second transistor T2 transmits the low level signal with threshold loss, a voltage of the third node N3 is Vin−Vth2, that is, VL−Vth2, and Vth2 represents a threshold voltage of the second transistor T2. Since a gate of a sixth transistor T6 receives the first power signal VL, and the sixth transistor T6 is turned on, the voltage VL−Vth2 is transmitted to a first node N1 by the sixth transistor T6. For example, Vth6 represents a threshold voltage of the sixth transistor T6. Similarly, since the sixth transistor T6 transmits the low level signal with threshold loss, a voltage of the first node N1 is VL−VthN1, and VthN1 is the smaller one of Vth2 and Vth6. The voltage of the first node N1 may control an eighth transistor T8 to be conducted, and the second clock control signal is written into an output end G(n) by the eighth transistor T8 to serve as an output signal. That is, in the input stage t1, the output signal is a second clock control signal with a high level, that is, a second power signal VH.

In the input stage t1, since the first clock control signal is a low level signal, the first transistor T1 is conducted, and the first power signal VL is transmitted to a second node N2 by the first transistor T1. Since a voltage of the third node N3 is VL−Vth2, an seventh transistor T7 is conducted, and the first clock control signal with the low level is transmitted to the second node N2 by the seventh transistor T7. For example, Vth7 represents a threshold voltage of the seventh transistor T7; Vth1 represents the threshold voltage of the first transistor T1; if Vth1<Vth7+Vth2, a voltage of the second node N2 is VL−Vth7−Vth2; and if Vth1>Vth7+Vth2, the voltage of the second node N2 is VL−Vth1. In this case, a third transistor T3 and a fourth transistor T4 are both conducted. Since the second clock control signal is a high level signal, a fifth transistor T5 is turned off.

In an output stage t2, the first clock control signal provided by the first clock signal end CB is a high level signal, the second clock control signal provided by the second clock signal end CK is a low level signal, and an input signal Vin provided by an input voltage signal end STV is a high level signal. The eighth transistor T8 is conducted, and the second clock control signal is written into the output end G(n) by the eighth transistor T8 to serve as an output signal. In the input stage t1, a voltage of an end of a second capacitor C2 connected to the output end G(n) is the second power signal VH, and a voltage of an end of the second capacitor C2 connected to the first node N1 is VL−VthN1. However, in the output stage t2, a voltage of the end of the second capacitor C2 connected to the output end G(n) is VL. Due to a bootstrap effect of the second capacitor C2, the voltage of the end of the second capacitor C2 connected to the first node N1 is 2VL−VthN1−VH, that is, the voltage of the first node N1 becomes 2VL−VthN1−VH. In this case, the sixth transistor T6 is turned off, the eighth transistor T8 may be better turned on, and the output signal is the first power signal VL.

In the output stage t2, the first clock control signal is a high level signal, so that the second transistor T2 and the first transistor T1 are both turned off. The voltage of the third node N3 is still VL−VthN1, the seventh transistor T7 is conducted, and the first clock control signal with the high level is transmitted to the second node N2 by the seventh transistor T7, that is, the voltage of the second node N2 is the second power signal VH. Thus, the third transistor T3 and the fourth transistor T4 are both turned off. Since the second clock control signal is a low level signal, the fifth transistor T5 is conducted.

In a buffer stage t3, the first clock control signal provided by the first clock signal end CB and the second clock control signal provided by the second clock signal end CK are both high level signals, and the input signal Vin provided by the input voltage signal end STV is a high level signal. The eighth transistor T8 is conducted, and the second clock control signal is written into the output end G(n) by the eighth transistor T8 to serve as the output signal. In this case, the output signal is the second clock control signal with the high level, that is, the second power signal VH. Due to the bootstrap effect of the second capacitor C2, the voltage of the first node N1 becomes VL−VthN1.

In the buffer stage t3, the first clock control signal is a high level signal, so that the second transistor T2 and the first transistor T1 are both turned off. The voltage of the first node N1 becomes VL−VthN1, the sixth transistor T6 is conducted, the voltage of the third node N3 is also VL−VthN1, the seventh transistor T7 is conducted, and the first clock control signal with the high level is transmitted to the second node N2 by the seventh transistor T7, that is, the voltage of the second node N2 is the second power signal VH. Thus, the third transistor T3 and the fourth transistor T4 are both turned off. Since the second clock control signal is a high level signal, the fifth transistor T5 is turned off.

In a first sub-stage t41 of a stabilization stage t4, the first clock control signal provided by the first clock signal end CB is a low level signal, the second clock control signal provided by the second clock signal end CK is a high level signal, and the input signal Vin provided by the input voltage signal end STV is a high level signal, for example, the input signal Vin is equal to the second power signal VH. Since the first clock control signal is a low level signal, the second transistor T2 is conducted, and the input signal Vin is transmitted to the third node N3 by the second transistor T2. Since the second transistor T2 transmits a high level signal without threshold loss, the voltage of the third node N3 is Vin (that is, the second power signal VH), and the seventh transistor T7 is turned off. Since the sixth transistor T6 is in a turned-on state, the voltage of the first node N1 is the same as that of the third node N3, that is, the voltage of the first node N1 is VH, and the eighth transistor T8 is turned off. Since the first clock control signal is a low level signal, the first transistor T1 is conducted, the voltage of the second node N2 is VL−Vth1, the third transistor T3 and the fourth transistor T4 are both conducted, and the second power signal VH is transmitted to the output end G(n) by the third transistor T3, that is, the output signal is the second power signal VH.

In a second sub-stage t42 of the stabilization stage t4, the first clock control signal provided by the first clock signal end CB is a high level signal, the second clock control signal provided by the second clock signal end CK is a low level signal, and the input signal Vin provided by the input voltage signal end STV is a high level signal. The voltages of the first node N1 and the voltage of the third node N3 are Vin (that is, the second power signal VH), and the eighth transistor T8 and the seventh transistor T7 are both turned off. Since the first clock control signal is a high level signal, the second transistor T2 and the first transistor T1 are both turned off. Due to a holding effect of a first capacitor C1, the voltage of the second node N2 is still VL−Vth1, the third transistor T3 and the fourth transistor T4 are both conducted, the second power signal VH is transmitted to the output end G(n) by the third transistor T3, and the output signal is the second power signal VH.

In the second sub-stage t42, since the second clock control signal is a low level signal, the fifth transistor T5 is conducted, and the second power signal VH is transmitted to the third node N3 and the first node N1 by the fourth transistor T4 and the fifth transistor T5, so as to maintain the voltage of the first node N1 and the voltage of the third node N3 at a high level.

In a third sub-stage t43 of the stabilization stage t4, the first clock control signal provided by the first clock signal end CB and the second clock control signal provided by the second clock signal end CK are both high level signals, and the input signal Vin provided by the input voltage signal end STV is a high level signal. The voltages of the first node N1 and the voltage of the third node N3 are VH, and the eighth transistor T8 and the seventh transistor T7 are turned off. Since the first clock control signal is a high level signal, the second transistor T2 and the first transistor T1 are both turned off, the voltage of the second node N2 is still VL−Vth1, and the third transistor T3 and the fourth transistor T4 are both conducted. The second power signal VH is transmitted to the output end G(n) by the third transistor T3, and the output signal is the second power signal VH.

The output end G(n) of the above shift register is connected to a gate signal line 11 of the row of pixels, and a signal output by the output end G(n) is a gate scanning signal. When the gate scanning signal is input to the pixel circuit 200 of the row of pixels, a data signal of each column data signal lines may be written into the corresponding pixel circuit.

Figure 4:
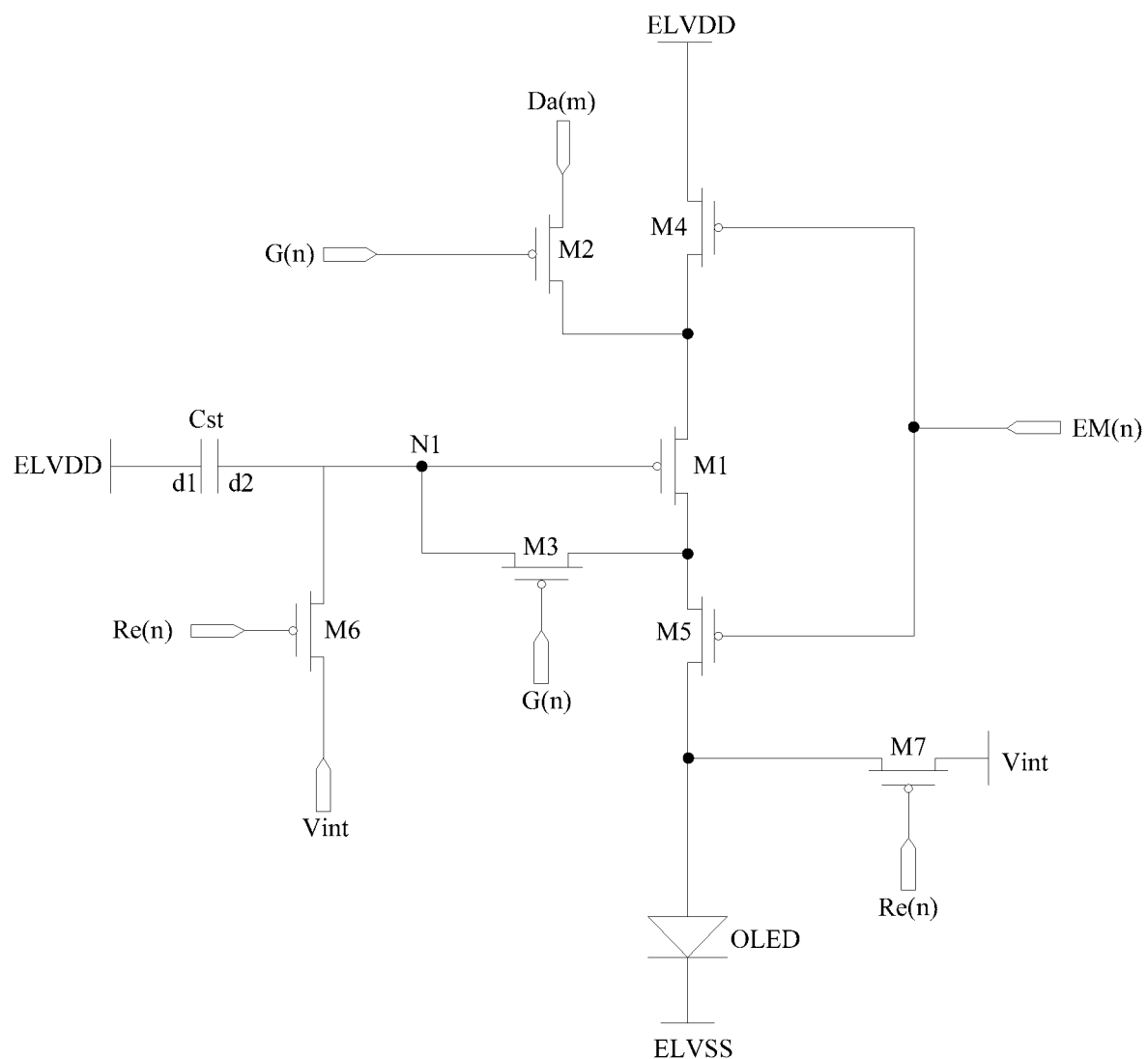
FIG. 4 is an equivalent circuit diagram of a pixel circuit according to an embodiment of the present disclosure.
Figure 5:
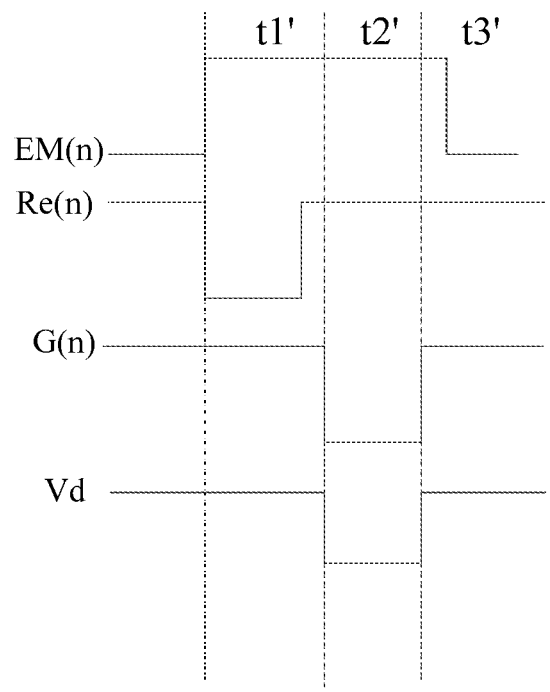
FIG. 5 is a time sequence diagram of the pixel circuit shown in FIG. 4.

FIG. 4 is an equivalent circuit of a pixel circuit according to an embodiment of the present disclosure, and FIG. 5 is a time sequence diagram of the pixel circuit shown in FIG. 4.

With reference to FIGS. 4 and 5, the pixel drive circuit provided in embodiments of the present disclosure includes a drive transistor M1, a first switch transistor M3, a second switch transistor M6, a first control transistor M2, a second control transistor M4, a third control transistor M5, a fourth control transistor M7 and a storage capacitor Cst.

A source of the first switch transistor M3 is electrically connected to a gate of the drive transistor M1, a drain of the first switch transistor M3 is electrically connected to a drain of the drive transistor M1; and a gate of the first switch transistor M3 is electrically connected to an nth row of gate signal line G(n).

A gate of the second switch transistor M6 is electrically connected to a nth row of reset line Re(n), a drain of the second switch transistor M6 is electrically connected to the gate of the drive transistor M1, and a source of the second switch transistor M6 is electrically connected to an initial voltage signal line Vint.

A gate of the first control transistor M2 is electrically connected to a nth row of gate signal line G(n), a source of the first control transistor M2 is electrically connected to an m-th column of data signal line Da(m), and a drain of the first control transistor M2 is electrically connected to a source of the drive transistor M1.

A gate of the second control transistor M4 is electrically connected to a nth row of light emitting control line EM(n), a source of the second control transistor M4 is electrically connected to a power signal line ELVDD, and a drain of the second control transistor M4 is electrically connected to the source of the drive transistor M1.

A gate of the third control transistor M5 is electrically connected to a nth row of light emitting control line EM(n), a source of the third control transistor M5 is electrically connected to the drain of the drive transistor M1, a drain of the third control transistor M5 is electrically connected to an anode of an OLED, and a cathode of the organic light emitting diode (OLED) is electrically connected to a low voltage signal line ELVSS.

A gate of the fourth control transistor M7 is electrically connected to an (n+1)th row of reset signal line Re(n+1), a drain of the fourth control transistor M7 is electrically connected to the anode of the OLED, and a source of the fourth control transistor M7 is electrically connected to the initial voltage signal line Vint.

A first electrode plate d1 of the storage capacitor Cst is electrically connected to the power signal line ELVDD, and the gate of the drive transistor M1 may be multiplexed as a second electrode plate d2 of the storage capacitor Cst.

Where, n is a positive integer, and m is a positive integer. The transistors in the pixel circuits provided in embodiments of the present disclosure are p-type thin film transistors, and a low level is an active level.

Drive of the pixel circuits is divided into three stages, that is, a reset stage, a data writing stage and a light emitting stage.

In a first stage t1' (reset stage), a low level is input to Re(n), a high level is input to G(n), a high level is input to EM(n), M6 is turned on, and a potential of the gate of M1 is reset to an initial voltage.

In a second stage t2' (data writing and threshold voltage compensation stage), a high level is input to Re(n), a low level is input to G(n), a data voltage Vd is input to Da(m), a high level is input to EM(n), M6 is turned off, M4 and M5 are turned off, M2, M3, M1 and M7 are turned on, Vd charges Cst by M2, M1 and M3, so as to increase the potential of the gate of M1 until the potential of the gate of M1 becomes Vd+Vth (Vth is the threshold voltage of M1), M3 is turned off, the potential of N1 is stored by Cst, and at the same time, M7 is turned on, so as to reset a potential of the anode of OLED to an initial voltage.

In a third stage t3' (light emitting stage), a high level is input to Re(n), a high level is input to G(n), a low level is input to EM(n), M2, M3, M6 and M7 are turned off, M1, M4 and M5 are conducted, the OLED emits light, and a drive current I of M1 driving the OLED to emit light is equal to $K(Vd-Vdd)^2/2$, where K is a current coefficient, and Vdd is a voltage of a power signal input by ELVDD.

In a process of manufacturing a display panel, the data signal line 21 is close to the power signal line 22, so that when a signal on the data signal line jumps, a voltage transmitted on the power signal line 22 may jump due to a coupling effect between the two signal lines. It can be seen from FIG. 4 that a signal of the power signal line 22 is input to one electrode plate d1 of the storage capacitor Cst, and the data signal is written into the other electrode plate d2 of the storage capacitor Cst in the data writing stage. Due to a bootstrap effect of the storage capacitor Cst, if the power signal transmitted by the power signal line ELVDD jumps, a data signal of the other electrode plate d2 of the storage capacitor Cst may be unstable, finally causing a difference in display brightness.

Through the above analysis, it can be seen that: in FIG. 2, the second clock signal end CK controls the gate scanning signal G(n) to be output, the output gate scanning signal G(n) is the same as the second clock control signal output by the second clock signal end CK, and the data signal is written into the pixel circuit according to the gate scanning signal.

Figure 6:
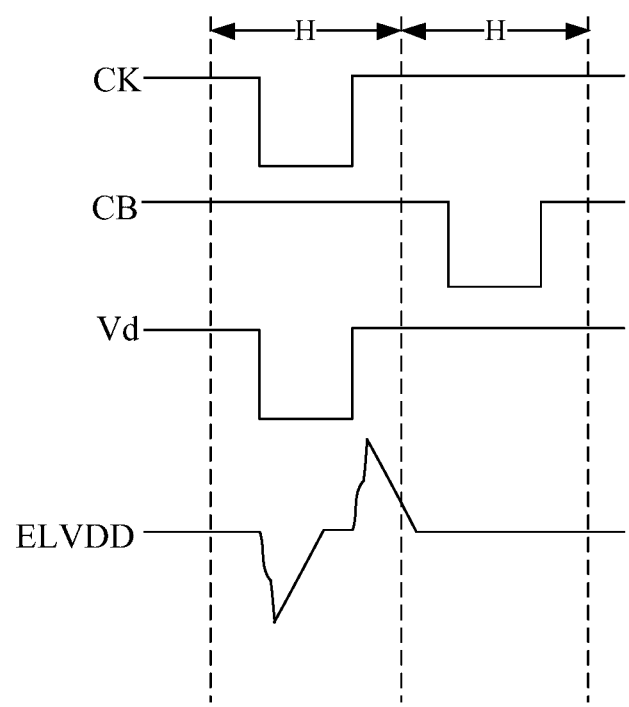
FIG. 6 is a time sequence diagram according to the related art.

FIG. 6 is a time sequence diagram according to the related art. With reference to FIG. 6, when an active level (low level) is input to the second clock signal end CK, a data signal Vd output by a data signal line is written into a storage capacitor of a pixel circuit. When the data signal line outputs a data signal to different rows of pixels, if the data signal output by the data signal line jumps, for example, when the data signal Vd changes from a high level to a low level and from a low level to a high level in FIG. 6, a power signal ELVDD transmitted by the power signal line changes with the change of the data signal, and the power signal ELVDD may be recovered to a fixed potential after a period of time. Thus, in the data writing stage, that is, in the situation that a period in which the clock control signal output by the second clock signal end CK maintains at a low level and a period in which the power signal ELVDD is unstable have an overlap, the data signal written into the pixel circuit may be inaccurate.

In order to overcome the above problem, embodiments of the present disclosure provide a drive method for a display panel. When the gate drive circuit scans pixels line by line, the clock signal end (that is, the second clock signal end in FIG. 2) is controlled to input a clock control signal (that is, the above second clock control signal) to the gate drive circuit, so as to enable the gate drive circuit to output a gate scanning signal, and the data signal output by the data signal end is controlled to be written into the row of pixel circuits.

Figure 7:
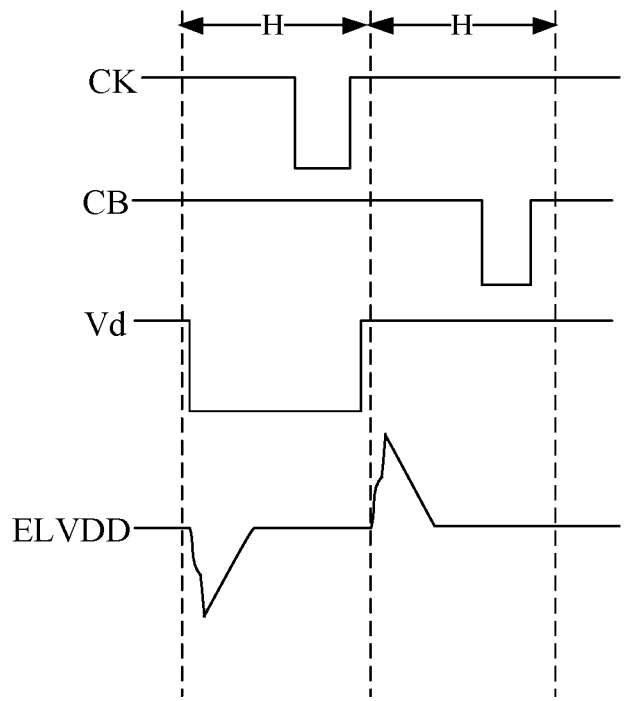
FIG. 7 is a time sequence diagram according to an embodiment of the present disclosure.

FIG. 7 is a time sequence diagram according to an embodiment of the present disclosure. With reference to FIG. 7, in the drive method provided in an embodiment of the present disclosure, an active level of the clock control signal (CK) is a low level, the gate scanning signal output by the gate drive circuit is controlled to be output by the clock control signal (CK), and a period and a duty ratio of an active level period of the gate scanning signal are the same as those of the clock control signal (CK). The pixel circuits of the row of pixels writes the data signal (Vd) transmitted by the data line connected to the row of pixels into the corresponding pixel circuits when the gate signal line connected to the pixel circuits outputs the active level of the gate scanning signal. Thus, the data writing time of each row of pixels is controlled by the clock control signal (CK).

The active level period of the clock control signal (CK) refers to a period in which an active level is output in a cycle, that is, in a period H in which one row of pixels are scanned; and the active level period of the data signal (Vd) refers to a period in which an active level is output in a period H in which one row of pixels are scanned. It can be seen from FIG. 7 that the clock control signal (CK) is provided with a plurality of active low level periods, where one active level period corresponds to a data writing period of one row of pixels. Thus, in an embodiments of the present disclosure, one active level period of the clock control signal may be controlled to fall within the active level period of the data signal (Vd) of the corresponding pixel row, and a start time of the active level period of the data signal (Vd) is at least 1 μs-2 μs earlier than that of the active level period of the clock control signal (CK).

In the above drive method provided in embodiments of the present disclosure, a drive chip is coded to control the start time and the end time of outputting the data signal (Vd) by the data signal end, and control the start time and the end time of outputting the clock control signal (CK) by the clock signal end, so that the start time of the active level period of the data signal (Vd) is advanced in a period H in which one row of pixels is scanned, thereby causing the power signal (ELVDD) to fluctuate in advance. Thus, the active level period of the clock control signal (CK) does not overlap or slightly overlaps with a fluctuation period of the power signal (ELVDD), that is, the period in which the data signal (Vd) is written into the pixel circuit does not overlap or slightly overlaps with the fluctuation period of the power signal (ELVDD), thereby preventing an influence of a fluctuation of the power signal on writing of the data signal, and preventing a difference in brightness of the row of pixels.

Through actual measurement, it can be determined that when a fluctuation of the power signal transmitted by the power signal line occurs due to a jump of the data signal transmitted by the data signal line, the fluctuation may be recovered to a fixed potential after about 1 μs-2 μs. Thus, in embodiments of the present disclosure, the start time of the active level period of the data signal is set to be at least 1 μs-2 μs earlier than that of the active level period of the clock control signal, which may guarantee that when the clock control signal enters the active level period, the power signal has recovered to a set value. Thus, in the active period of the clock control signal, that is, in the period in which data is written into the pixel circuits, the power signal remains at a fixed potential, and writing of the data signal is not influenced.

Comparing FIGS. 6 and 7, it can be seen that the active level period of the clock control signal (CK) and the active level period of the data signal (Vd) are substantially the same in the related art, and each occupies about half of the scanning period H of one row of pixels. In order to achieve the above effect, in embodiments of the present disclosure, on the premise of guaranteeing normal display of a display picture, the active level period of the clock control signal (CK) is shortened, so as to provide a period of time for a fluctuation of the power signal (ELVDD) and shorten overlapping time of the fluctuation period of the power signal (ELVDD) and the active level period of the clock control signal (CK).

As shown in FIG. 7, in embodiments of the present disclosure, the active level period of the clock control signal (CK) is shortened, so that in the scanning period H of one pixel row, a duty ratio of the active level period of the clock control signal (CK) is less than 50%.

Moreover, in embodiments of the present disclosure, the active level period of the data signal (Vd) is lengthened, so that the start time of the active level period of the data signal (Vd) is closer to the start time of the scanning period of the row of pixels, and the end time of the active level period of the data signal (Vd) is closer to the end time of the scanning period of the row of pixels. In this way, a time difference between the start time of the active level period of the data signal (Vd) and the start time of the active level period of the clock control signal (CK) may be increased, thereby causing the power signal (ELVDD) to fluctuate in advance, and providing sufficient time for recovery of the power signal (ELVDD), so as to guarantee that the fluctuation period of the power signal (ELVDD) does not overlap with the active level period of the clock control signal (CK).

As shown in FIG. 7, in embodiments of the present disclosure, the active level period of the data signal (Vd) is lengthened, so that in the scanning period H of one pixel row, the duty ratio of the active level period of the data signal (Vd) is greater than 50%.

Through the above arrangement, the active level period of the clock control signal (CK) is less than or equal to half of the active level period of the data signal (Vd). In this way, the fluctuation period of the power signal (ELVDD) and a writing period of the data signal (Vd) may be prevented from overlapping, thereby preventing an influence of the fluctuation of the power signal (ELVDD) on the written data signal (Vd).

As shown in FIGS. 6 and 7, the data signal (Vd) causes the power signal (ELVDD) to fluctuate not only when the data signal (Vd) jumps from a high level to a low level, but also when the data signal (Vd) jumps from a low level to a high level.

As shown in FIG. 7, in embodiments of the present disclosure, in order to prevent the influence of the power signal (ELVDD) on the writing of the data signal (Vd), the end time of the active level period of the clock control signal (CK) is set to be earlier than that of the active level period of the data signal (Vd), so that even if the data signal (Vd) has an influence on the power signal (ELVDD), the period in which the influence is generated does not overlap with the active level period of the clock control signal (CK), that is, the writing of the data signal is not influenced, thereby further preventing the influence of the power signal (ELVDD) on the writing of the data signal (Vd).

In embodiments of the present disclosure, the end time of the active level period of the clock control signal (CK) is set to be at least 1 µs-2 µs earlier than that of the active level period of the data signal (Vd). The power supply signal (ELVDD) requires about 1 µs-2 µs to recover to a fixed potential after fluctuation. Through the above setting, it can be guaranteed that the fluctuation of the power supply signal (ELVDD) may not influence the writing of the data signal (Vd).

During specific implementation, the scanning time of one row of pixels is about 7 µs, the start time of the active level period of the data signal (Vd) is required to be at least 1 µs later than that of the scanning period of the row of pixels, and the end time of the active level period of the data signal (Vd) is required to be at least 1 µs earlier than that of the scanning period of the row of pixels.

In embodiments of the present disclosure, the active level period of the data signal (Vd) may be set to be 4 µs-6 µs. The start time of the active level period of the data signal (Vd) is required to be 1 µs-2 µs earlier than that of the active level period of the clock control signal (CK), so that the active level period of the clock control signal (CK) may be set to be 2 µs-3 µs.

Figure 8:
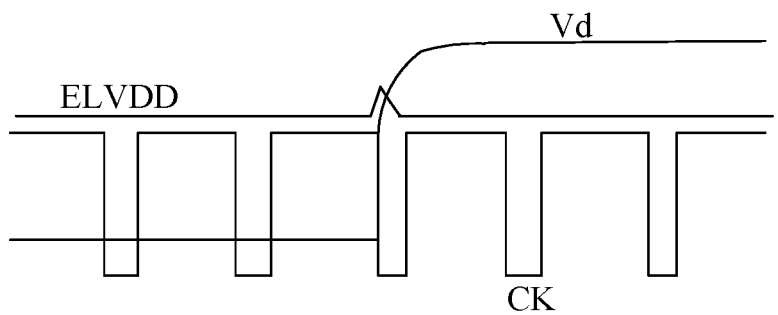
FIG. 8 is a first simulated time sequence diagram according to the related art.
Figure 9:
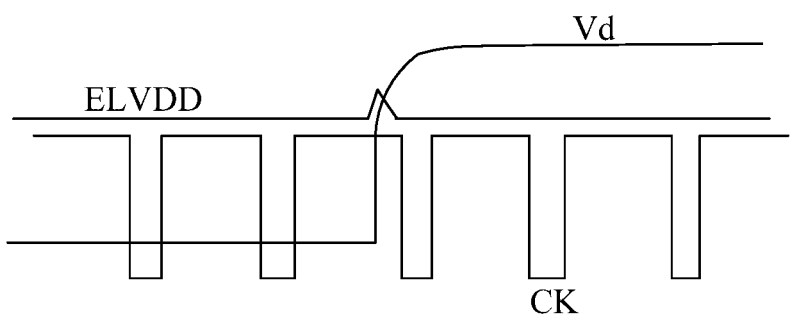
FIG. 9 is a first simulated time sequence diagram according to an embodiment of the present disclosure.

FIGS. 8 and 9 are comparison diagrams before and after adjustment of an active level period of each signal in the situation that a display picture is converted from a white picture to a black picture.

As shown in FIG. 8, before the active level period of the clock control signal (CK) and the active level period of the data signal (Vd) are adjusted, when the data signal (Vd) jumps from the low level corresponding to the white picture to the high level corresponding to the black picture, the power signal (ELVDD) fluctuates, and fluctuation time of the power signal (ELVDD) overlaps with the active level period of the clock control signal (CK). In this way, a fluctuation of the power signal (ELVDD) may influence the writing of the data signal (Vd), and finally display brightness will be influenced.

As shown in FIG. 9, when the above drive method provided in embodiments of the present disclosure is adopted to adjust the active level period of the clock control signal (CK) and the active level period of the data signal (Vd), the time of the data signal changed from the low level corresponding to the white picture to the high level corresponding to the black picture is advanced (Vd), so that the power signal (ELVDD) fluctuates in advance. Thus, the time when the power signal (ELVDD) fluctuates does not overlap with the active level period of the clock control signal (CK), and in this way, the fluctuation of the power signal (ELVDD) does not influence the writing of the data signal (Vd), and the display brightness is not influenced.

Figure 10:
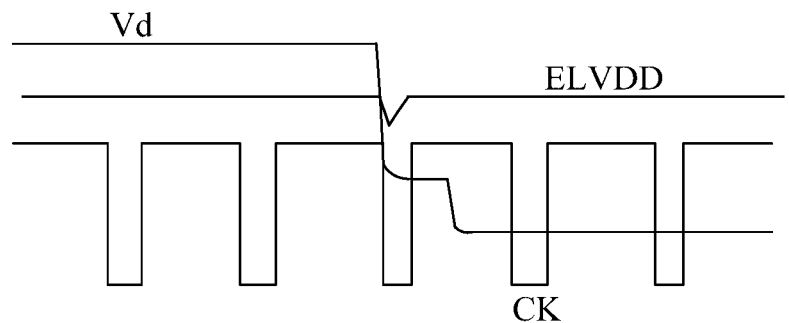
FIG. 10 is a second simulated time sequence diagram according to the related art.
Figure 11:
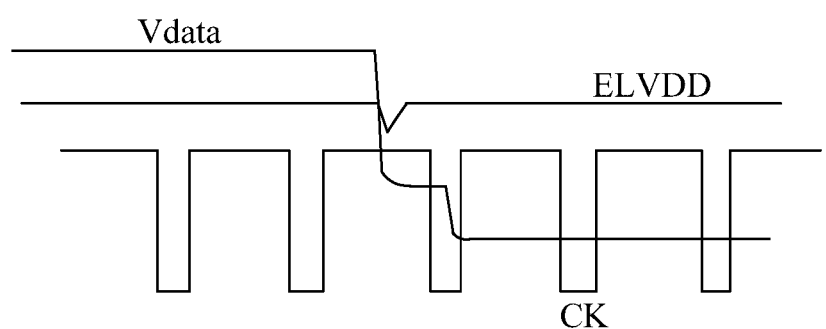
FIG. 11 is a second simulated time sequence diagram according to an embodiment of the present disclosure.

FIGS. 10 and 11 are comparison diagrams before and after adjustment of an active level period of each signal in the situation that a display picture is converted from a black picture to a white picture.

As shown in FIG. 10, before the active level period of the clock control signal (CK) and the active level period of the data signal (Vd) are adjusted, when the data signal (Vd) jumps from the high level corresponding to the black picture to the low level corresponding to the white picture, the power signal (ELVDD) fluctuates, and fluctuation time of the power signal (ELVDD) overlaps with the active level period of the clock control signal (CK). In this way, the fluctuation of the power signal (ELVDD) may influence the writing of the data signal (Vd), and finally the display brightness will be influenced.

As shown in FIG. 11, when the above drive method provided in embodiments of the present disclosure is adopted to adjust the active level period of the clock control signal (CK) and the active level period of the data signal (Vd), the time of the data signal changed from the high level corresponding to the black picture to the low level corresponding to the white picture is advanced (Vd), so that the power signal (ELVDD) fluctuates in advance. Thus, the fluctuation time of the power signal (ELVDD) does not overlap with the active level period of the clock control signal (CK), and in this way, the fluctuation of the power signal (ELVDD) does not influence the writing of the data signal (Vd), and the display brightness is not influenced.

On the basis of the same inventive concept, embodiments of the present disclosure further provide a display panel. The structure of the display panel can be obtained with reference to FIG. 1. The display panel provided in embodiments of the present disclosure includes: a plurality of pixels (not shown in the figure), a gate drive circuit 100, a pixel circuit 200 and a drive chip 300.

The pixels of the display panel are distributed in a display area, each pixel is correspondingly connected to one pixel circuit 200, and the gate drive circuit 100 is arranged in a non-display area on one side of the display area. The gate drive circuit 100 is configured to output a gate scanning signal to the pixel circuits 200, and a data signal is written into the pixel circuits 200 under the control of the gate scanning signal. The data signal is a signal for controlling a gray scale of light emitting brightness of the pixel, and the gray scales of the pixels may be controlled by writing different data signals into the pixel circuits 200 corresponding to the pixels.

Data signal lines 21 and power signal lines 22 connected to the pixel circuits 200, and an initial signal input end of the gate drive circuit 100 are all connected to a drive chip 300. The drive chip 300 provides an initial signal and a clock control signal of the gate drive circuit, and provides the data signals and power signals. The start time and the end time of the active level of each signal above may be set by coding the drive chip 300.

In embodiments of the present disclosure, when the gate drive circuit 100 scan pixels line by line, the drive chip 300 controls a clock signal end to input a clock control signal into the gate drive circuit 100, so as to enable the gate drive circuit 100 to output the gate scanning signal, and the data signal output by the data signal end is controlled to be written into the row of pixel circuits 200.

An active level period of the clock control signal falls within an active level period of the data signal, and start time of the active level period of the data signal is at least 1 µs-2 µs earlier than that of the active level period of the clock control signal.

According to the above display panel provided in embodiments of the present disclosure, a period in which the data signal is written into the pixel circuits does not overlap or slightly overlaps with a fluctuation period of the power signal, thereby preventing an influence of a fluctuation of the power signal on writing of the data signal, and preventing a difference in brightness of the row of pixels.

Although the preferred embodiments of the present disclosure have been described, those of ordinary skill in the art can make additional changes and modifications to these embodiments once they learn the basic inventive concept. Therefore, the appended claims are intended to be interpreted as including the preferred embodiments and all changes and modifications falling within the scope of the present disclosure.

Obviously, those skilled in the art can make various changes and variations to the present disclosure without departing from the spirit and scope of the present disclosure. In this way, if these changes and variations of the present disclosure fall within the scope of the claims of the present disclosure and equivalent technologies thereof, the present disclosure is further intended to include these changes and variations.

What is claimed is:

1. A drive method for a display panel, wherein the display panel comprises:
   a plurality of pixels, configured to display a picture;
   a plurality of pixel circuits, configured to control the plurality of pixels to emit light for display; and
   a gate drive circuit arranged on a side of the plurality of pixel circuits and configured to output a gate scanning signal to the plurality of pixel circuits;
   wherein the drive method comprises:
   controlling, when the gate drive circuit scans the plurality of pixels line by line, a clock signal end to input a clock control signal to the gate drive circuit, to make the gate drive circuit to output the gate scanning signal, and controlling a data signal output by a data signal end to be written into a row of pixel circuits;
   wherein an active level period of the clock control signal falls within an active level period of the data signal, and a start time of the active level period of the data signal is at least 1 µs-2 µs earlier than that of the active level period of the clock control signal;
   wherein a duty ratio of the active level period of the data signal in a scanning period of a row of pixels is greater than 50%.

2. The drive method according to claim 1, wherein a duty ratio of the active level period of the clock control signal in the scanning period of the row of pixels is less than 50%.

3. The drive method according to claim 2, wherein the active level period of the clock control signal is less than or equal to half of that of the data signal.

4. The drive method according to claim 1, wherein an end time of the active level period of the clock control signal is earlier than that of the active level period of the data signal.

5. The drive method according to claim 4, wherein the end time of the active level period of the clock control signal is at least 1 µs-2 µs earlier than that of the active level period of the data signal.

6. The drive method according to claim 1, wherein the active level period of the data signal is 4 µs-6 µs.

7. The drive method according to claim 6, wherein the active level period of the clock control signal is 2 µs-3 µs.

8. The drive method according to claim 1, wherein the start time of the active level period of the data signal is at least 1 µs later than that of a scanning period of a row of pixels.

9. The drive method according to claim 8, wherein an end time of the active level period of the data signal is at least 1 µs earlier than that of the scanning period of the row of pixels.

10. The drive method according to claim 1, wherein the active level period of the data signal is 4 µs-6 µs.

11. The drive method according to claim 2, wherein the active level period of the data signal is 4 µs-6 µs.

12. The drive method according to claim 3, wherein the active level period of the data signal is 4 µs-6 µs.

13. The drive method according to claim 4, wherein the active level period of the data signal is 4 µs-6 µs.

14. The drive method according to claim 5, wherein the active level period of the data signal is 4 µs-6 µs.

15. The drive method according to claim 1, wherein the start time of the active level period of the data signal is at least 1 µs later than that of a scanning period of the row of pixels.

16. The drive method according to claim 2, wherein the start time of the active level period of the data signal is at least 1 µs later than that of a scanning period of the row of pixels.

17. The drive method according to claim 3, wherein the start time of the active level period of the data signal is at least 1 µs later than that of a scanning period of the row of pixels.

18. The drive method according to claim 4, wherein the start time of the active level period of the data signal is at least 1 µs later than that of a scanning period of a row of pixels.

19. A display panel, comprising:
   a plurality of pixels, configured to display a picture;
   a plurality of pixel circuits, configured to control the plurality of pixels to emit light for display;
   a gate drive circuit arranged on a side of the plurality of pixel circuits and configured to output a gate scanning signal to the plurality of pixel circuits; and
   a drive chip connected to the gate drive circuit and the plurality of pixel circuits, wherein the drive chip is configured to output a control signal to the gate drive circuit and the plurality of pixel circuits;
   wherein when the gate drive circuit scans the plurality of pixels line by line, the drive chip controls a clock signal end to input a clock control signal to the gate drive circuit, to make the gate drive circuit to output the gate scanning signal, and controls a data signal output by a data signal end to be written into a row of pixel circuits; and
   an active level period of the clock control signal falls within an active level period of the data signal, and a start time of the active level period of the data signal is at least 1 µs-2 µs earlier than that of the active level period of the clock control signal;
   wherein a duty ratio of the active level period of the data signal in a scanning period of a row of pixels is greater than 50%.

* * * * *